United States Patent
Ji

(10) Patent No.: US 11,862,228 B2
(45) Date of Patent: Jan. 2, 2024

(54) POWER SUPPLY CIRCUIT AND MEMORY

(71) Applicant: CHANGXIN MEMORY TECHNOLOGIES, INC., Hefei (CN)

(72) Inventor: Rumin Ji, Hefei (CN)

(73) Assignee: CHANGXIN MEMORY TECHNOLOGIES INC., Hefei (CN)

( * ) Notice: Subject to any disclaimer, the term of this patent is extended or adjusted under 35 U.S.C. 154(b) by 204 days.

(21) Appl. No.: 17/668,638

(22) Filed: Feb. 10, 2022

(65) Prior Publication Data

US 2023/0014679 A1    Jan. 19, 2023

Related U.S. Application Data

(63) Continuation of application No. PCT/CN2021/120424, filed on Sep. 24, 2021.

(30) Foreign Application Priority Data

Jul. 16, 2021 (CN) .......................... 202110807082.0

(51) Int. Cl.
*G11C 8/14* (2006.01)
*G11C 11/4074* (2006.01)

(52) U.S. Cl.
CPC ................................ *G11C 11/4074* (2013.01)

(58) Field of Classification Search
CPC .................................................. G11C 11/4074
USPC ........................................................ 365/226
See application file for complete search history.

(56) References Cited

U.S. PATENT DOCUMENTS

| | | | |
|---|---|---|---|
| 7,817,147 B2 | 10/2010 | Lee | |
| 2007/0109290 A1 | 5/2007 | Lee | |
| 2012/0120735 A1* | 5/2012 | Kubouchi | G11C 29/028 365/189.05 |
| 2014/0078842 A1* | 3/2014 | Oh | G11C 29/808 365/200 |

FOREIGN PATENT DOCUMENTS

| | | |
|---|---|---|
| CN | 101335513 A | 12/2008 |
| CN | 110011654 A | 7/2019 |
| CN | 110518930 A | 11/2019 |
| CN | 212322144 U | 1/2021 |
| CN | 213602558 U | 7/2021 |

* cited by examiner

*Primary Examiner* — Vu A Le
(74) *Attorney, Agent, or Firm* — Cooper Legal Group, LLC

(57) ABSTRACT

A power supply circuit and a memory are provided. The power supply circuit includes a voltage source, multiple power supply circuits and a control circuit. The multiple power supply circuits are connected to the voltage source. If the voltage source is effective and the multiple power supply circuits are in an enable state, a voltage of a power supply terminal is pulled up to a preset voltage, and power is supplied to the load units during the pulling up process. A first-type power circuit enters the enable state if a first enable signal is received, and each of second-type power supply circuits enters the enable state if second enable signal is received.

20 Claims, 7 Drawing Sheets

POWER SUPPLY CIRCUIT AND MEMORY

CROSS-REFERENCE TO RELATED APPLICATION

The present disclosure is a US continuation of International Application No. PCT/CN2021/120424, filed on Sep. 24, 2021, which claims priority to Chinese patent application No. 202110807082.0, filed on Jul. 16, 2021 and entitled "POWER SUPPLY CIRCUIT AND MEMORY" and submitted to the Chinese Patent Office. The disclosures of International Application No. PCT/CN2021/120424 and Chinese patent application No. 202110807082.0 are hereby incorporated by reference in their entireties.

BACKGROUND

Multiple internal power supplies for different purposes will be generated in a Dynamic Random Access Memory (DRAM) chip. These internal power supplies are generated by stepping up or stepping down external input voltages (e.g. VDD/VPPEX). For example, a high voltage higher than VPPEX or a negative voltage may be generated through a charge pump, and various voltages lower than VDD or VPPEX may be generated through a Low Dropout Regulator (LDO). The stability of the external input voltage is the basis for the normal start of the chip.

SUMMARY

This disclosure relates to, but is not limited to, a power supply circuit and a memory.

Embodiments of the present disclosure provide a power supply circuit. The power supply circuit includes a voltage source, multiple power supply circuits and a control circuit. The multiple power supply circuits are connected to the voltage source. The multiple power supply circuit have power supply terminals and load units. If the voltage source is effective and the multiple power supply circuits are in an enable state, the multiple power supply circuits pull up voltages of the power supply terminals to a preset voltage, and supplies power to the load units during the pulling up process. The multiple power supply circuit include at least one first-type power supply circuit and second-type power supply circuits. The first-type power supply circuit is configured to receive a first enable signal, and enters the enable state if the first enable signal is received. Each of the second-type power supply circuits are configured to receive second enable signal, and enter the enable state if the second enable signal is received. The control circuit is configured to receive a flag signal, and transmit the first enable signal to the first-type power supply circuit if the received flag signal is in an effective state, the effective state characterizing the effectiveness of the voltage source. The control circuit is further configured to: receive a plurality of external signals after transmitting the first enable signal, each of the external signals corresponding to one of the second-type power supply circuits and start times of different external signals being different, and transmit a second enable signal to a corresponding second-type power supply circuit if the flag signal and an external signal are received.

The embodiments of the present disclosure also provide a memory. The memory includes the power supply circuit of the above.

BRIEF DESCRIPTION OF THE DRAWINGS

One or more embodiments are illustratively explained by the figures in the corresponding drawings. These exemplified descriptions do not constitute a limitation on the embodiments. The elements with the same reference numerals in the drawings are denoted as similar elements. Unless otherwise stated, the figures in the drawings do not constitute a proportion limit. In order to explain the technical solutions in the embodiments of the present disclosure or a conventional technology more clearly, drawings required to be used in the description of the embodiments will be briefly introduced below. It is apparent that the drawings in the description below are only some embodiments of the present disclosure. For those of ordinary skill in the art, other drawings may also be obtained based on these drawings without creative work.

DETAILED DESCRIPTION

Figure 1:
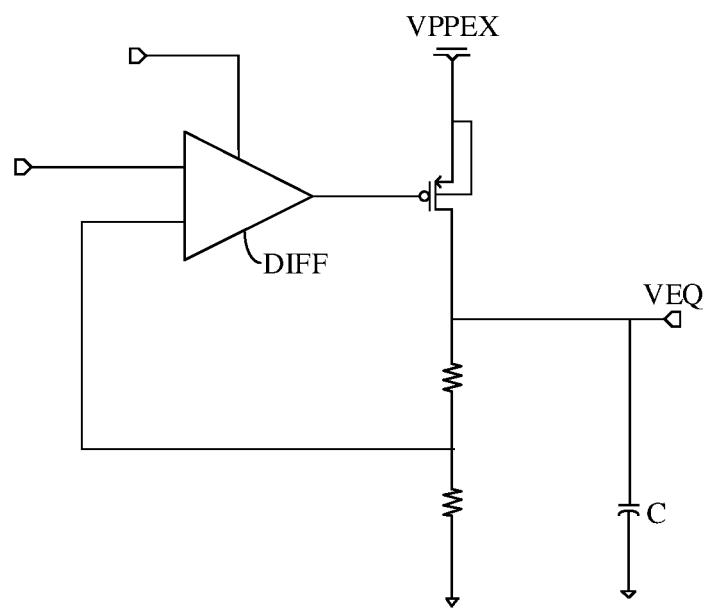
FIG. 1 is a schematic structural diagram of a power supply circuit.

Regardless of a charge pump or an LDO, the load unit needs to be charged during start, which may generate a surge current to an external input voltage VDD or VPPEX. Referring to FIG. 1, for example, when an LDO is started, an output voltage VEQ is initially low and much lower than a target voltage, resulting in a low output voltage of an operational amplifier DIFF. At this time, a gate-to-source voltage difference of an output PMOS transistor is relatively great, resulting in a large on-current of the output PMOS transistor. The load unit C draws a large current from an external voltage source VPPEX.

Figure 2:
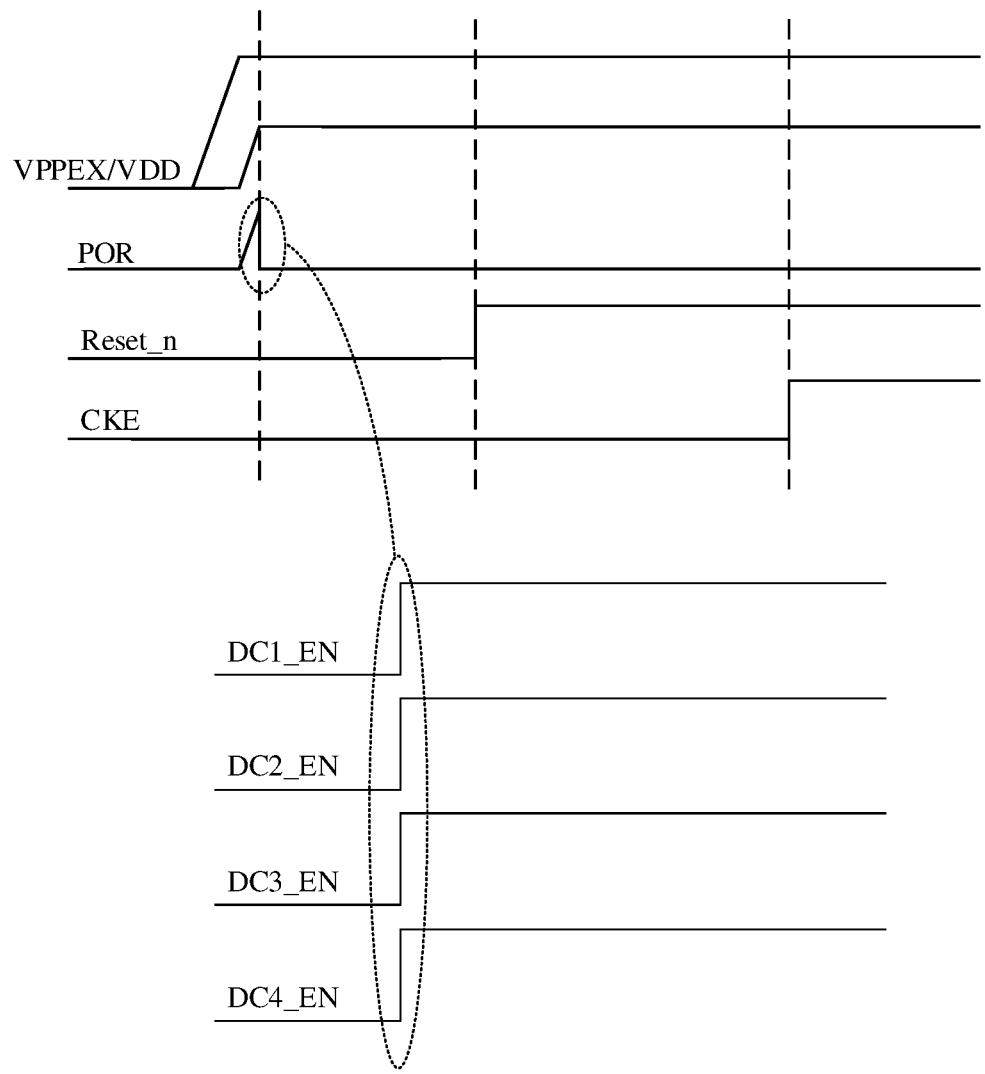
FIG. 2 and FIG. 4 are operation timing diagrams of the power supply circuit provided by embodiments of the present disclosure.

At present, referring to FIG. 2, after a flag signal POR, which characterizes the effectiveness of the voltage source, is in an effective state, a plurality of enable signals (DC1_EN . . . DC4_EN) for controlling the start of the multiple power supply circuits are generated simultaneously. That is, after the voltage source is effective, the multiple power supply circuits are started at the same time. If the multiple power supply circuits are started at the same time, the surge currents generated by different power supply circuits during the start will be superimposed to produce a greater surge current. An excessive surge current will pull down the external input voltage VDD or VPPEX, resulting in the output voltage of the power supply circuit not meeting the requirements, which may cause a functional circuit that depends on the output voltage to start not to start normally, or even cause a chip to fail to start.

The embodiments of the present disclosure provide a power supply circuit and a memory. A plurality of external signals are received after transmitting a first enable signal used for starting a first-type power supply circuit. Since the second enable signal is generated based on a flag signal and an external signal, a start time of a second-type power supply circuit is later than a start time of the first-type power supply circuit. Moreover, since each external signal corresponds to a second-type power supply circuit, asynchronous start of different second-type power supply circuits may be implemented by controlling start times of different external signals to be different. As such, it is beneficial to reducing the number of power supply circuits that are started at the same time, thereby ensuring the normal start of the chip. In addition, in the embodiments of the present disclosure, external signals are used to control the asynchronous start of the power supply circuits without setting a special delay circuit, which is beneficial to save the chip area.

In order to make the objectives, technical solutions and advantages of the embodiments of the present disclosure more clear, various embodiments of the present disclosure will be described in detail below in combination with the accompanying drawings. However, it can be understood by those skilled in the art that in various embodiments of the present disclosure, many technical details have been proposed in order to give the reader a better understanding of the present disclosure. However, the technical solutions claimed in the present disclosure may be implemented even without these technical details and may be implemented through various changes and modifications based on the following various embodiments.

Figure 3:
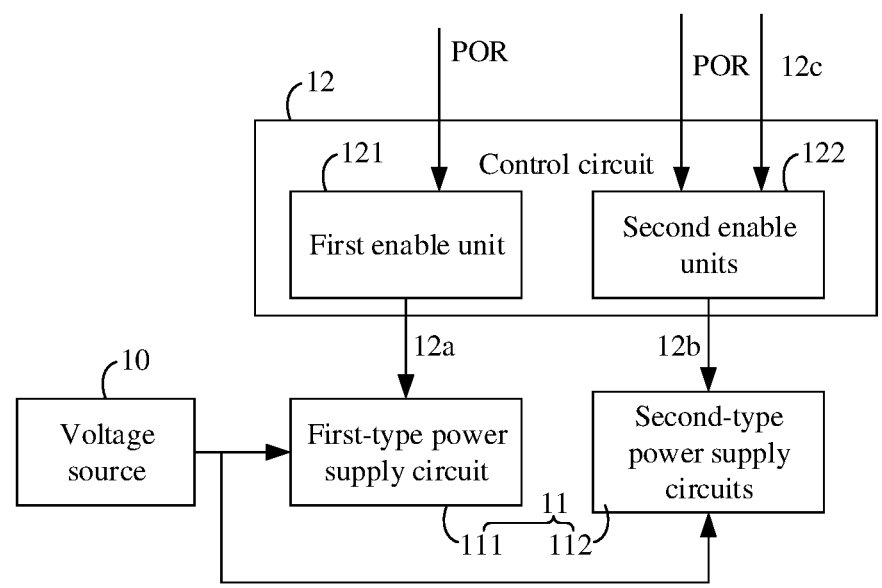
FIG. 3 and FIG. 6 are schematic structural diagrams of a power supply circuit provided by embodiments of the present disclosure.

Referring to FIG. 3, the power supply circuit includes a voltage source 10, multiple power supply circuits 11 and a control circuit. The multiple power supply circuits are connected to the voltage source 10. The multiple power supply circuits 11 have power supply terminals (not shown) and load units (not shown). If the voltage source 10 is effective and the multiple power supply circuits 11 are in an enable state, the multiple power supply circuits 11 pull up voltages of the power supply terminals to a preset voltage, and supplies power to the load units during the pulling up operation. The multiple power supply circuit 11 include at least one first-type power supply circuit 111 and second-type power supply circuits 112. The first-type power supply circuit 111 is configured to receive a first enable signal 12a, and enters the enable state if the first enable signal 12a is received. Each of second-type power supply circuits 112 is configured to receive a second enable signal 12b, and enter the enable state if the second enable signal 12b is received. The control circuit 12 is configured to receive a flag signal POR, and transmit the first enable signal 12a to the first-type power supply circuit 111 if the received flag signal POR is in an effective state, the effective state characterizing the effectiveness of the voltage source 10. The control circuit is further configured to receive a plurality of external signals 12c after transmitting the first enable signal 12a, each of the external signals 12c corresponding to one of the second-type power supply circuits 112, and start times of different external signals 12c being different, and transmit the second enable signal 12b to a corresponding second-type power supply circuit 112 if the flag signal POR and the external signal 12c are received.

The first-type power supply circuit 111 and the second-type power supply circuits 112 are distinguished according to the received enable signals. The first-type power supply circuit 111 includes at least one power supply circuit 11, and the second-type power supply circuits 112 include at least two power supply circuits. The difference between the first enable signal 12a and the second enable signals 12b is mainly due to different generating conditions, and the difference between different second enable signals 12b is mainly due to different start times. The effectiveness of the voltage source 10 means that the voltage source 10 has a rated output voltage.

Figure 4:
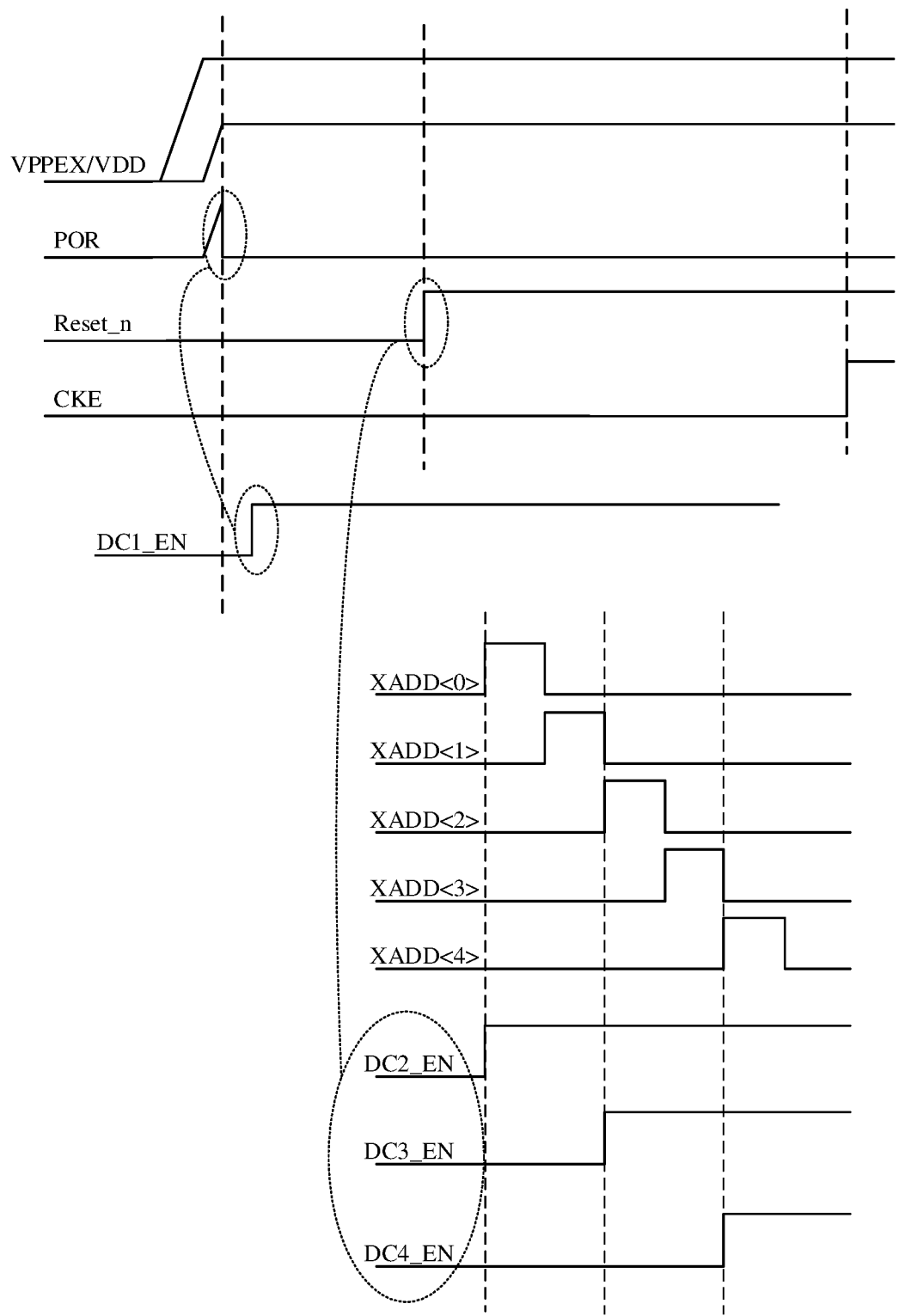

In some embodiments, referring to FIG. 4, the flag signal POR is effective at a high level, and the level of the flag signal POR increases with the start of the voltage VDD/ VPPEX of the voltage source 10. When the voltage of the voltage source 10 increases to the rated value, the level of the flag signal POR is at the high level, that is, the effective state, and then the level of the flag signal POR falls back from the high level to a low level. In some other embodiments, the flag signal POR is effective at the low level, or, the level of the flag signal POR is at the high level as long as the voltage of the voltage source 10 is at the rated value.

In some embodiments, the control circuit 12 includes a first enable unit 121 and a plurality of second enable units 122. An output terminal of each of the second enable units 122 is connected to an enable terminal of one corresponding second-type power supply circuit 112. The first enable unit 121 is configured to receive the flag signal POR, and transmit the first enable signal 12a after the flag signal POR reaches the effective state. The second enable units 122 are configured to receive the flag signal POR and the external signals 12c and transmit the second enable signals 12b. The external signals 12c received by different second enable units 122 are different. It can be understood that functions of the first enable unit 121 and the second enable units 122 are limited by functions of the control circuit 12. The first enable unit 121 transmits the first enable signal 12a only after the flag signal POR is in the effective state, and the second enable units 122 transmit the second enable signals 12b only after receiving the flag signal POR and the external signals 12c.

In some embodiments, the flag signal POR, the external signals 12c, the first enable signal 12a, and the second enable signals 12b are the high-level effective signals, which means that the flag signal POR, the external signals 12c, the first enable signal 12a, and the second enable signals 12b are effective at high level. The first enable unit 121 generates the first enable signal 12a based on the flag signal POR. The waveform parameter of the flag signal POR and the waveform parameter of the first enable signal 12a may be the same or different, and the waveform parameter includes the duration of the high level. The second enable units 122 generate the second enable signals 12b based on the flag signal POR and the external signals 12c. The device structure of the second enable units 122 may be adjusted according to the level of the flag signal POR at the start time of the external signal 12c. Moreover, the start time of the second enable signal 12b may be the same or different from the start time of the corresponding external signal 12c. It is only necessary to ensure that the start times of different second enable signals 12b generated based on different external signals 12c are different, and the intervals between start times of adjacent second enable signals 12b are greater than a preset duration.

The setting of the preset duration is related to the current-time change relationship of the surge current generated when a single power supply circuit 11 is started. In some embodiments, the preset duration is greater than or equal to the duration of the surge current during start of one power supply circuit 11. That is, after one power supply circuit 11 is fully started, another power supply circuit 11 is started. As such, the surge current may be minimized and the voltage stability of the voltage source 10 may be ensured. In some other embodiments, the preset duration is less than the duration of the surge current generated during the start of the single power supply circuit 11, but the surge current of two power supply circuits 11 after superposition is less than a preset surge threshold of the voltage source 10. The preset surge threshold means that a surge current with a current value less than this threshold will not pull down the voltage of the voltage source 10. That is, another power supply circuit 11 is started before one power supply circuit 11 is fully started, so that the two surge currents are superimposed, but the superimposed current value will not pull down the output voltage of the voltage source 10.

In some embodiments, the second enable unit 122 includes an SR latch. Specifically, referring to FIG. 5, the SR latch includes a first NOR gate 21 and a second NOR gate 22, a first input terminal of the first NOR gate 21 is configured to receive the external signal 12c, a second input terminal of the first NOR gate 21 is connected to an output terminal of the second NOR gate 22, an output terminal of the first NOR gate 21 is connected to a first input terminal of the second NOR gate 22, a second input terminal of the second NOR gate 22 is configured to receive the flag signal POR, the output terminal of the second NOR gate 22 serves as an output terminal of the second enable unit 122, and the output terminal of the second NOR gate 22 is configured to output the second enable signal 12b. It can be understood that when the external signal 12c is at a low level and the flag signal POR is at a high level, the second NOR gate 22 outputs the low level, the first NOR gate 21 outputs the high level, and the second enable unit 122 outputs the low level, when the external signal 12c remains at the low level and the flag signal POR falls back to the low level, the second enable unit 122 remains outputting the low level, and when the flag signal POR is at the low level and the external signal 12c increases to the high level, the first NOR gate 21 outputs the low level, the output terminal of the second NOR gate 22 outputs the high level, and the second enable unit 122 outputs the high level, i.e., generating the second enable signal 12b.

The external signal 12c being at the low level includes the following two cases. First, the first NOR gate 21 does not receive the external signal 12c, and the external signal 12c is pulled down in a suspended state, thus exhibiting the low level. Second, the external signal 12c received by the first NOR gate 21 is at the low level.

In some embodiments, with continued reference to FIG. 4, the external signals 12c include anti-fuse address signals, and the start times of different anti-fuse address signals are different. The anti-fuse address signals are high-level signals inside the chip. By using anti-fuse address signals as external signals, there is no need to provide an additional circuit inside the chip to generate external signals, which is beneficial to save the chip area. Moreover, there is no need to provide an additional circuit to receive the external signals from the outside of the chip, thereby avoiding failure of normal start of the chip caused by fluctuations in the external signals, and improving the start stability of the chip.

In some embodiments, the control circuit 12 is further configured to receive m anti-fuse address signals, recorded as first anti-fuse address signals, and select n anti-fuse address signals therefrom, recorded as second anti-fuse address signals. Intervals between start times of adjacent second anti-fuse address signals are the same, and the intervals between the start times of the adjacent second anti-fuse address signals are greater than intervals between start times of adjacent first anti-fuse address signals. The second anti-fuse address signals are used as the external signals 12c. That is, the control circuit may make the intervals between the start times of the adjacent first anti-fuse address signals less than the above preset duration. In other words, when the intervals between the start times of the adjacent first anti-fuse address signals are unequal, the first anti-fuse address signals are screened, so that the intervals between the start times of the screened adjacent second anti-fuse address signals meets the requirement of being greater than or equal to the preset duration.

It should be noted that an independent screening unit may be provided in the control circuit 12. The screening unit performs a screening operation on the m anti-fuse address signals according to requirements for the intervals between the start times. The requirements include the equality and specific values of the intervals between adjacent start times.

Figure 6:
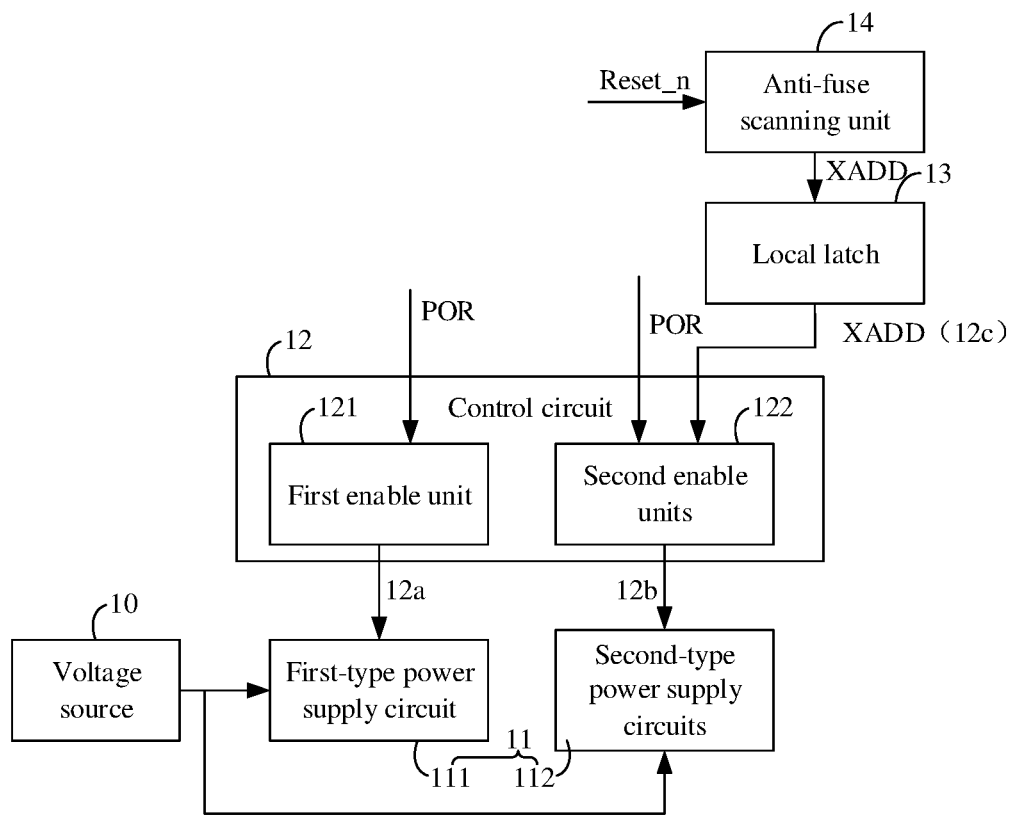

In some embodiments, referring to FIG. 6, the control circuit 12 is further connected to an anti-fuse scanning unit 14. The anti-fuse scanning unit 14 is configured to scan address information of the anti-fuse array and generate anti-fuse address signals XADD. The control circuit 12 is configured to receive the anti-fuse address signals XADD generated by the anti-fuse scanning unit 14.

In some embodiments, the anti-fuse scanning unit 14 is further configured to receive a reset signal Reset_n. The reset signal Reset_n is configured to trigger the anti-fuse scanning unit 14 to scan the address information of the anti-fuse array. A reception time of the reset signal Reset_n is later than a reception time of the effective state of the flag signal POR. The control circuit 12 may receive the flag signal POR in the effective state firstly, and generate the first enable signal 12a based on the flag signal POR in the effective state to enable the first-type power supply circuit 111. The control circuit then receives the external signals 12c, and generates the second enable signals 12b based on the external signals 12c and the flag signal POR to enable the second-type power supply circuits 112. That is, the control circuit 12 can effectively control the asynchronous start of the first-type power supply circuit 111 and the second-type power supply circuits 112.

In some embodiments, the control circuit 12 is further connected to the anti-fuse scanning unit 14 through a local latch 13. The anti-fuse scanning unit 14 is further configured to transmit the generated anti-fuse address signals XADD to the local latch 13. The control circuit 12 is further configured to receive the anti-fuse address signals XADD from the local latch 13.

In some embodiments, each of the load units includes a filter capacitor. For example, the power supply circuit 11 may be an LDO structure, and the filter capacitor may be connected to the power supply terminal of the power supply circuit 11.

In some embodiments, the control circuit 12 is configured to transmit the first enable signal 12a and the second enable signals 12b before generation of a clock enable signal CKE to enable the first-type power supply circuit 111 and the second-type power supply circuits 112. Before the generation of the clock enable signal CKE, the DRAM has not started a read-write or refresh operation, and it is not necessary to enable all power supply circuits 11. Therefore, it is only necessary to enable all power supply circuits 11 before the generation of the CKE signal.

Figure 5:
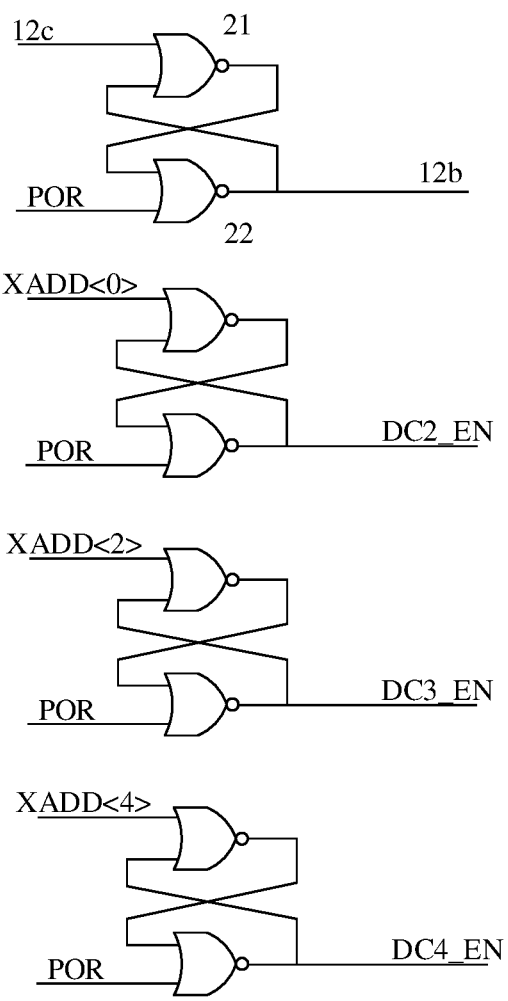
FIG. 5 is a schematic structural diagram of second enable units in the power supply circuit shown in FIG. 3.

A specific embodiment of the present disclosure will be explained in detail below in conjunction with FIG. 4 to FIG. 6. In this specific embodiment, the first-type power supply circuit 111 includes one power supply circuit 11, which is recorded as a first power supply circuit. The second-type power supply circuits 112 include three power supply circuits, which are recorded as a second power supply circuit, a third power supply circuit and a fourth power supply circuit respectively.

After the flag signal POR is in the effective state, the first enable unit 111 transmits the first enable signal 12a, that is, DC1_EN, to the first power supply circuit. After the reset signal Reset_n is generated, the control circuit 12 acquires, through the local latch 13, the anti-fuse address signals XADD in the high-level scanned by the anti-fuse scanning unit 14, for example, XADD<0:4>. After acquiring the anti-fuse address signals XADD, the control circuit 12 selects 3 groups of the signals from XADD<0:4>, specifically XADD<0>, XADD<2>, and XADD<4>. Since the flag signal POR is at the low level after acquiring the anti-fuse address signals XADD, the second enable units 122 may respectively generate the second enable signals 12b based on the selected anti-fuse address signals XADD and the flag signal POR, specifically DC2_EN, DC3_EN, and DC4_EN. The start time of DC2_EN is the same as the start time of XADD<0>, the start time of DC3_EN is the same as the start time of XADD<2>, and the start time of DC4_EN is the same as the start time of XADD<4>. DC2_EN is transmitted to the second power supply circuit to enable the second power supply circuit, DC3_EN is transmitted to the third power supply circuit to enable the third power supply circuit, and DC4_EN is transmitted to the fourth power supply circuit to enable the fourth power supply circuit, thereby implementing the asynchronous start of the second power supply circuit, the third power supply circuit and the fourth power supply circuit.

In this embodiment, since the second enable signals is generated based on the flag signal and the external signals, the asynchronous start of the first-type power supply circuit and the second-type power supply circuits may be implemented by receiving a plurality of external signals after transmitting the first enable signal. Moreover, since each of the external signals corresponds to one second-type power supply circuit, the asynchronous start of different second-type power supply circuits may be implemented by controlling the start times of different external signals to be different. As such, it is beneficial to reducing the number of power supply circuits that are started at the same time, and preventing a surge current caused by simultaneous start from pulling down the voltage of the voltage source, thereby ensuring that the voltage of the power supply terminal meets the requirement and ensuring that the functional current connected to the power supply terminal starts normally. In addition, the use of the external signals to control the asynchronous start of the power supply circuits eliminates the need to provide a special delay circuit, which is beneficial to saving the chip area.

Accordingly, the embodiments of the present disclosure also provide a memory including the power supply circuit of any of the above.

Figure 7:
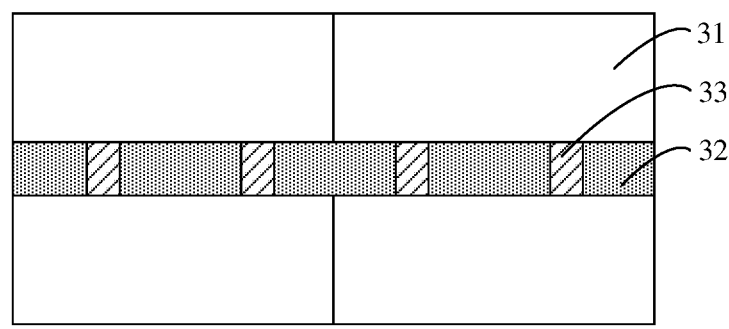
FIG. 7 is a schematic structural diagram of a memory provided by embodiments of the present disclosure.

In some embodiments, referring to FIG. 7, the power supply circuits 33 are located in a peripheral circuit area 32 between adjacent memory banks 31. Each memory bank 31 is a memory array area composed of memory units. Further, a plurality of power supply circuits 33 are evenly distributed in an extension direction of the peripheral circuit area 32.

In this embodiment, the multiple power supply circuits in the memory are asynchronously started. The voltage of the voltage source has high stability. The power supply terminal voltages of the power supply circuits can meet driving requirements. The functional circuits connected to the power supply terminals can be started normally and effectively.

In some embodiments, the units mentioned in the disclosure may be sub-circuits or hardware components. For example, the control unit may be a control sub-circuit or a control component, the first enable unit may be a first enable sub-circuit or a first enable component, the anti-fuse scanning unit may be a anti-fuse scanning sub-circuit or a anti-fuse scanning component, and the memory unit may be a memory sub-circuit or a memory component, etc.

It should be understood that, singular forms "a/an", "one", and "the" may include the plural forms, unless otherwise specified types in the context. It is also to be understood that, terms such as "comprising/containing" or "having" appoint existence of declarative features, wholes, steps, operations, components, parts or combinations of them, but not excluding the possibility of existence or adding of one or more other features, wholes, steps, operations, components, parts or combinations of them. Meanwhile, in the specification, term "and/or" includes any and all combinations of the related listed items.

It can be understand by those skilled in the art that the above-mentioned implementations are specific embodiments for implementing the present disclosure, and in practical applications, various changes may be made in form and details without departing from the spirit and scope of the present disclosure. Any person skilled in the art may make changes and modifications without departing from the spirit and scope of the present disclosure. Therefore, the scope of protection of the present disclosure shall be subject to the scope defined in the claims.

INDUSTRIAL APPLICABILITY

In the embodiments of the present disclosure, the power supply circuit includes: a voltage source, multiple power supply circuits and a control circuit. The multiple power supply circuits are connected to the voltage source. If the voltage source is effective and the multiple power supply circuits are in an enable state, a voltage of a power supply terminal is pulled up to a preset voltage by the multiple power supply circuits and the load unit is supplied with power by the multiple power supply circuits during the pulling up operation. A first-type power circuit enters the enable state if a first enable signal is received, and second-type power supply circuits enter the enable state if second enable signals are received. The control circuit is configured to receive a flag signal, and transmit the first enable signal if the received flag signal is in an effective state, the effective state characterizing the effectiveness of the voltage source. The control circuit is further configured to receive a plurality of external signals after transmitting the first enable signal, each of the external signals corresponding to one of second-type power supply circuits and start times of different external signals being different, and transmit a corresponding second enable signal if the flag signal and an external signal are received. The embodiments of the present disclosure are helpful to ensure the effective start of a chip connected to the power supply terminals.

The invention claimed is:
1. A power supply circuit, comprising:
 a voltage source and multiple power supply circuits connected to the voltage source, wherein the multiple power supply circuits have power supply terminals and load units, and when the voltage source is effective and the multiple power supply circuits are in an enable state, the multiple power supply circuits pull up voltages of the power supply terminals to a preset voltage, and supply power to the load units during the pulling up process,
 wherein the multiple the power supply circuits comprise at least one first-type power supply circuit and second-type power supply circuits, the first-type power supply circuit is configured to receive a first enable signal, and enter the enable state when the first enable signal is received, and each of the second-type power supply circuits is configured to receive a second enable signal, and enter the enable state when the second enable signal is received; and a control circuit configured to: receive a flag signal, and transmit the first enable signal to the first-type power supply circuit when the received flag signal is in an effective state, wherein the effective state characterizes an effectiveness of the voltage source, wherein the control circuit is further configured to: receive a plurality of external signals after transmitting the first enable signal, each of the external signals corresponding to one of the second-type power supply circuits and start times of different external signals being different; and transmit a second enable signal to a corresponding second-type power supply circuit when the flag signal and an external signal are received.

2. The power supply circuit of claim 1, wherein the control circuit comprises a first enable unit and a plurality of second enable units, an output terminal of each of the second enable units is connected to an enable terminal of a corresponding second-type power supply circuit, the first enable unit is configured to receive the flag signal, and transmit the first enable signal after the flag signal reaches the effective state, each second enable unit is configured to receive the flag signal and an external signal and transmit a second enable signal, and the external signals received by different second enable units are different.

3. The power supply circuit of claim 2, wherein the flag signal, the external signals, the first enable signal and the second enable signals are high-level effective signals.

4. The power supply circuit of claim 3, wherein each second enable unit comprises an SR latch.

5. The power supply circuit of claim 4, wherein the SR latch comprises a first NOR gate and a second NOR gate, a first input terminal of the first NOR gate being configured to receive the external signal, a second input terminal of the first NOR gate being connected to an output terminal of the second NOR gate, an output terminal of the first NOR gate being connected to a first input terminal of the second NOR gate, a second input terminal of the second NOR gate being configured to receive the flag signal, the output terminal of the second NOR gate serving as an output terminal of the second enable unit, and the output terminal of the second NOR gate being configured to output the second enable signal.

6. The power supply circuit of claim 1, wherein the external signals comprise anti-fuse address signals, and start times of different anti-fuse address signals are different.

7. The power supply circuit of claim 6, wherein the control circuit is further configured to receive m first anti-fuse address signals and select n second anti-fuse address signals from the m first anti-fuse address signals, intervals between start times of adjacent second anti-fuse address signals are the same, the intervals between the start times of adjacent second anti-fuse address signals are greater than intervals between start times of the adjacent first anti-fuse address signals, and the second anti-fuse address signals are used as the external signals.

8. The power supply circuit of claim 6, wherein the control circuit is further connected to an anti-fuse scanning unit, the anti-fuse scanning unit is configured to scan address information of an anti-fuse array and generate the anti-fuse address signals, and the control circuit is configured to receive the anti-fuse address signals generated by the anti-fuse scanning unit.

9. The power supply circuit of claim 8, wherein the anti-fuse scanning unit is further configured to receive a reset signal, the reset signal is configured to trigger the anti-fuse scanning unit to scan the address information of the anti-fuse array, and a reception time of the reset signal is later than a reception time of the effective state of the flag signal.

10. The power supply circuit of claim 8, wherein the control circuit is further configured to connect to the anti-fuse scanning unit through a local latch, the anti-fuse scanning unit is further configured to transmit the generated anti-fuse address signals to the local latch, and the control circuit is further configured to receive the anti-fuse address signals from the local latch.

11. The power supply circuit of claim 1, wherein the load units comprise filter capacitors.

12. The power supply circuit of claim 1, wherein the control circuit is configured to transmit the first enable signal and the second enable signals before generation of a clock enable signal to enable the first-type power supply circuit and the second-type power supply circuits.

13. A memory comprising a power supply circuit, wherein the power supply circuit comprises:

a voltage source and multiple power supply circuits connected to the voltage source, wherein the multiple power supply circuits have power supply terminals and load units, and when the voltage source is effective and the multiple power supply circuits are in an enable state, the multiple power supply circuits pull up voltages of the power supply terminals to a preset voltage, and supplies power to the load units during the pulling up process, wherein the multiple the power supply circuits comprise at least one first-type power supply circuit and second-type power supply circuits, the first-type power supply circuit is configured to receive a first enable signal, and enter the enable state when the first enable signal is received, and each of the second-type power supply circuits is configured to receive a second enable signal, and enter the enable state when the second enable signal is received; and a control circuit configured to: receive a flag signal, and transmit the first enable signal to the first-type power supply circuit when the received flag signal is in an effective state, wherein the effective state characterizes an effectiveness of the voltage source, wherein the control circuit is further configured to: receive a plurality of external signals after transmitting the first enable signal, each of the external signals corresponding to one of the second-type power supply circuits and start times of different external signals being different; and transmit a second enable signal to a corresponding second-type power supply circuit when the flag signal and an external signal are received.

14. The memory of claim 13, wherein the power supply circuit is located in a peripheral circuit area between adjacent memory banks.

15. The memory of claim 14, wherein a plurality of power supply circuits are evenly distributed in an extension direction of the peripheral circuit area.

16. The memory of claim 13, wherein the control circuit comprises a first enable unit and a plurality of second enable units, an output terminal of each of the second enable units is connected to an enable terminal of a corresponding second-type power supply circuit, the first enable unit is configured to receive the flag signal, and transmit the first enable signal after the flag signal reaches the effective state, each second enable unit is configured to receive the flag signal and an external signal and transmit a second enable signal, and the external signals received by different second enable units are different.

17. The memory of claim 16, wherein the flag signal, the external signals, the first enable signal and the second enable signals are high-level effective signals.

18. The memory of claim 17, wherein each second enable unit comprises an SR latch.

19. The memory of claim 18, wherein the SR latch comprises a first NOR gate and a second NOR gate, a first input terminal of the first NOR gate being configured to receive the external signal, a second input terminal of the first NOR gate being connected to an output terminal of the second NOR gate, an output terminal of the first NOR gate being connected to a first input terminal of the second NOR gate, a second input terminal of the second NOR gate being configured to receive the flag signal, the output terminal of the second NOR gate serving as an output terminal of the second enable unit, and the output terminal of the second NOR gate being configured to output the second enable signal.

20. The memory of claim 13, wherein the external signals comprise anti-fuse address signals, and start times of different anti-fuse address signals are different.

* * * * *